US 12,453,086 B2

United States Patent
Lakshmanan et al.

(10) Patent No.: US 12,453,086 B2
(45) Date of Patent: *Oct. 21, 2025

(54) LOW RESISTIVITY METAL CONTACT STACK

(71) Applicant: Applied Materials, Inc., Santa Clara, CA (US)

(72) Inventors: Annamalai Lakshmanan, Fremont, CA (US); Jacqueline S. Wrench, San Jose, CA (US); Feihu Wang, San Jose, CA (US); Yixiong Yang, Fremont, CA (US); Joung Joo Lee, San Jose, CA (US); Srinivas Gandikota, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 691 days.

This patent is subject to a terminal disclaimer.

(21) Appl. No.: 17/335,241

(22) Filed: Jun. 1, 2021

(65) Prior Publication Data

US 2022/0277961 A1 Sep. 1, 2022

Related U.S. Application Data

(60) Provisional application No. 63/154,589, filed on Feb. 26, 2021.

(51) Int. Cl.
*C23C 16/455* (2006.01)
*H01L 21/02* (2006.01)
(Continued)

(52) U.S. Cl.
CPC ..... *H10B 12/488* (2023.02); *C23C 16/45553* (2013.01); *H01L 21/02491* (2013.01);
(Continued)

(58) Field of Classification Search
CPC ............ H10B 12/488; C23C 16/45553; H01L 21/02491; H01L 21/02631; H01L 21/2855;
(Continued)

(56) References Cited

U.S. PATENT DOCUMENTS 5,008,730 A * 4/1991 Huang ............... H01L 23/53257
257/E21.585
7,034,408 B1 * 4/2006 Schloesser ............. H10D 1/716
257/908
(Continued)

FOREIGN PATENT DOCUMENTS

CN 110875391 A 3/2020
JP 2001185553 A 7/2001
(Continued)

OTHER PUBLICATIONS

Wolfgang et al. "Influence of the deposition parameters on the texture and mechanical properties of magnetron sputtered cubic MoNx thin films", Materialia (2019). (Year: 2019).*
(Continued)

*Primary Examiner* — Rodney G McDonald
(74) *Attorney, Agent, or Firm* — SERVILLA WHITNEY LLC

(57) ABSTRACT

Methods for depositing a metal contact stack on a substrate are described. The metal stack includes a metal cap layer and a molybdenum conductor layer. The method includes depositing the metal cap layer on the substrate by physical vapor deposition (PVD) and depositing the molybdenum conductor layer by atomic layer deposition (ALD) on the metal cap layer.

15 Claims, 2 Drawing Sheets

(51) Int. Cl.
   *H01L 21/285* (2006.01)
   *H10B 12/00* (2023.01)
   *H10D 84/01* (2025.01)
   *H10D 84/03* (2025.01)

(52) U.S. Cl.
   CPC .... *H01L 21/02631* (2013.01); *H01L 21/2855* (2013.01); *H01L 21/28556* (2013.01); *H01L 21/28568* (2013.01); *H10D 84/0149* (2025.01); *H10D 84/0158* (2025.01); *H10D 84/038* (2025.01)

(58) Field of Classification Search
   CPC ......... H01L 21/28556; H01L 21/28568; H01L 21/823431; H01L 21/823475; H01L 21/28088
   USPC ...................................... 438/656; 204/298.11
   See application file for complete search history.

(56) References Cited

U.S. PATENT DOCUMENTS

| | | | |
|---|---|---|---|
| 9,640,482 B1 * | 5/2017 | Chen | H01L 21/76876 |
| 10,573,522 B2 | 2/2020 | Jandl et al. | |
| 10,790,287 B2 | 9/2020 | Kang et al. | |
| 10,833,087 B2 | 11/2020 | Fishburn et al. | |
| 11,587,936 B2 * | 2/2023 | Yang | C23C 16/45553 |
| 12,022,650 B2 * | 6/2024 | Yang | H01L 21/28556 |
| 2008/0258133 A1 | 10/2008 | Seong | |
| 2013/0234240 A1 | 9/2013 | Moon et al. | |
| 2018/0358362 A1 | 12/2018 | Yen et al. | |
| 2019/0057895 A1 | 2/2019 | Chen et al. | |
| 2019/0067094 A1 | 2/2019 | Zope et al. | |
| 2019/0341302 A1 | 11/2019 | Lei et al. | |
| 2020/0286897 A1 | 9/2020 | Panda et al. | |

FOREIGN PATENT DOCUMENTS

| | | |
|---|---|---|
| JP | 2011238700 A | 11/2011 |
| KR | 20180019487 A | 2/2018 |
| KR | 20200090088 A | 7/2020 |
| TW | 201701335 A | 1/2017 |
| WO | 2020106649 A1 | 5/2020 |
| WO | 2020185618 A1 | 9/2020 |

OTHER PUBLICATIONS

Anitha et al. "Deposition of molybdenum nitride thin films by r.f. reactive magnetron sputtering", Surface and Coatings Technology 79 (1996), 50-54. (Year: 1996).*

Schmidt et al. "Towards High Performance Gate Electrodes: Resistance Reduction in Molybdenum Films by Seed Layer Application", International Conference on Display Technology 2020 (vol. 52, Issue S1), pp. 170-174 (Year: 2020).*

PCT International Search Report and Written Opinion in PCT/US2022/017798 dated Jun. 13, 2022, 9 pages.

PCT International Search Report and Written Opinion in PCT/US2022/017912 dated Jun. 9, 2022, 11 pages.

* cited by examiner

LOW RESISTIVITY METAL CONTACT STACK

CROSS-REFERENCE TO RELATED APPLICATIONS

This application claims priority to U.S. Provisional Application No. 63/154,589, filed Feb. 26, 2021, the entire disclosure of which is hereby incorporated by reference herein.

TECHNICAL FIELD

Embodiments of the disclosure relate to methods for depositing a metal contact stack. More particularly, embodiments of the disclosure are directed to methods comprising depositing a metal cap layer on a substrate and depositing a molybdenum conductor layer on the metal cap layer.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET, including both planar and three-dimensional structures. An example of a three-dimensional structure is a FinFET device.

Drive current, and therefore speed, of a transistor is proportional to a gate width of the transistor. Faster transistors generally require larger gate width. There is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor.

An exemplary finFET or MOSFET includes a gate electrode on a gate dielectric layer on a surface of a semiconductor substrate. Source/drain regions are provided along opposite sides of the gate electrode. The source and drain regions are generally heavily doped regions of the semiconductor substrate. Usually a capped silicide layer, for example, titanium silicide capped by titanium nitride, is used to couple contacts, e.g., active and/or metal contacts, to the source and drain regions. Including a nitrogen-containing capping layer, however, can undesirably contribute to contact resistance.

Further, during middle-of-line (MOL) processes, a minimum via resistance for the MOL structures are targeted. A liner material (e.g., titanium nitride) is often required to improve adhesion of metals to dielectric materials to pass post-processing steps such as chemical-mechanical planarization (CMP) and to enhance CVD nucleation. However, the presence of the liner adds to the via resistance.

Therefore, there is a need in the art for transistors and MOL applications with decreased resistance.

SUMMARY

One or more embodiments of the disclosure are directed to methods of depositing a metal contact stack. In some embodiments, the method comprises depositing a metal cap layer on a substrate by physical vapor deposition (PVD) and depositing a molybdenum conductor layer by atomic layer deposition (ALD) on the metal cap layer.

Another aspect of the disclosure is directed to methods of depositing the metal contact stack having a sheet resistance in a range of from $10\mu\Omega$-cm to $20\mu\Omega$-cm. In one or more embodiments, the method comprises depositing a metal cap layer on a substrate by DC physical vapor deposition (PVD), wherein the substrate is exposed to a metal precursor comprising tungsten at a direct current of 35 KW, a bias of 1160 W, and depositing a molybdenum conductor layer by a thermal atomic layer deposition on the metal cap layer, wherein the metal cap layer is exposed to the molybdenum precursor. In one or more embodiments, the method comprises depositing a metal cap layer on a substrate by RF physical vapor deposition (PVD), wherein the substrate is exposed to a metal precursor comprising tungsten at a radio frequency of 3 KW, a bias of 50 W and a pressure of 230 mTorr, and depositing a molybdenum conductor layer by a thermal atomic layer deposition on the metal cap layer, wherein the metal cap layer is exposed to the molybdenum precursor. In one or more embodiments, the method comprises depositing a metal cap layer on a substrate by RF physical vapor deposition (PVD), wherein the substrate is exposed to a metal precursor comprising molybdenum at a radio frequency of 3 KW, a bias of 50 W and a pressure of 100 mTorr, and depositing a molybdenum conductor layer by a thermal atomic layer deposition on the metal cap layer, wherein the metal cap layer is exposed to the molybdenum precursor.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used herein, the term "fin field-effect transistor (FinFET)" refers to a MOSFET transistor built on a substrate where the gate is placed on two or three sides of the channel, forming a double- or triple-gate structure. FinFET devices have been given the generic name FinFETs because the channel region forms a "fin" on the substrate. FinFET devices have fast switching times and high current density.

One or more embodiments of the disclosure advantageously provide a combination of physical vapor deposition (PVD) metal liner/nucleation layer with atomic layer deposition (ALD) metal (e.g., molybdenum) fill. Some embodiments advantageously provide low resistivity stacks. Some embodiments provide methods with improved gap fill. Some embodiments provide methods that can be performed on fully integrated systems for in-situ deposition of the stack.

Embodiments of the disclosure provide processes for making a metal contact stack on a substrate which advantageously reduces resistance in logic device or memory device contacts. Resistance is reduced by eliminating nitrogen-based layers, e.g., a nitride cap layer and/or a nitride liner layer.

In one or more embodiments, a sheet resistance ($\mu\Omega$-cm) is measured for the metal contact stack having a total thickness of 100 Å. In one or more embodiments, the metal contact stack made according to one or more embodiments has a sheet resistance less than or equal to 40 $\mu\Omega$-cm, less than or equal to 30 $\mu\Omega$-cm, less than or equal to 25$\mu\Omega$-cm, or less than or equal to 20$\mu\Omega$-cm, or less than or equal to 15$\mu\Omega$-cm at a total thickness of 100 Å. In some embodiments, the metal contact stack has a sheet resistance less than or equal to 20 $\mu\Omega$-cm at a total thickness of 100 Å. In one or more embodiments, the metal contact stack formed by the method 100 has a sheet resistance in a range of from 50$\mu\Omega$-cm to 5 $\mu\Omega$-cm, from 40$\mu\Omega$-cm to 10$\mu\Omega$-cm, from 30$\mu\Omega$-cm to 10$\mu\Omega$-cm, from 25$\mu\Omega$-cm to 10$\mu\Omega$-cm, from 20$\mu\Omega$-cm to 10$\mu\Omega$-cm at a total thickness of 100 Å.

As used in this specification and the appended claims, the terms "precursor", "reactant", "reactive gas" and the like are used interchangeably to refer to any gaseous species that can react with the substrate surface.

Figure 1:
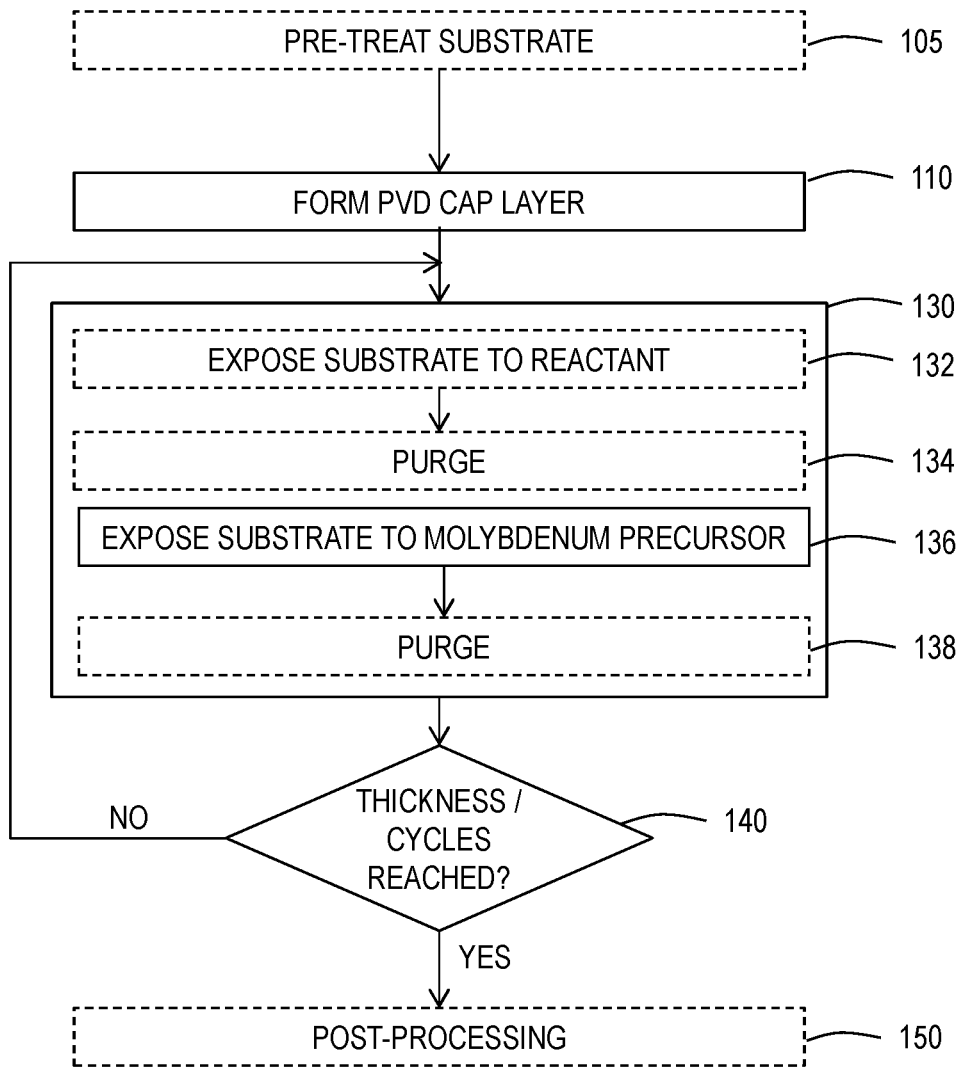
FIG. 1 illustrates a process flow diagram of a method in accordance with one or more embodiments of the disclosure.
Figure 2:
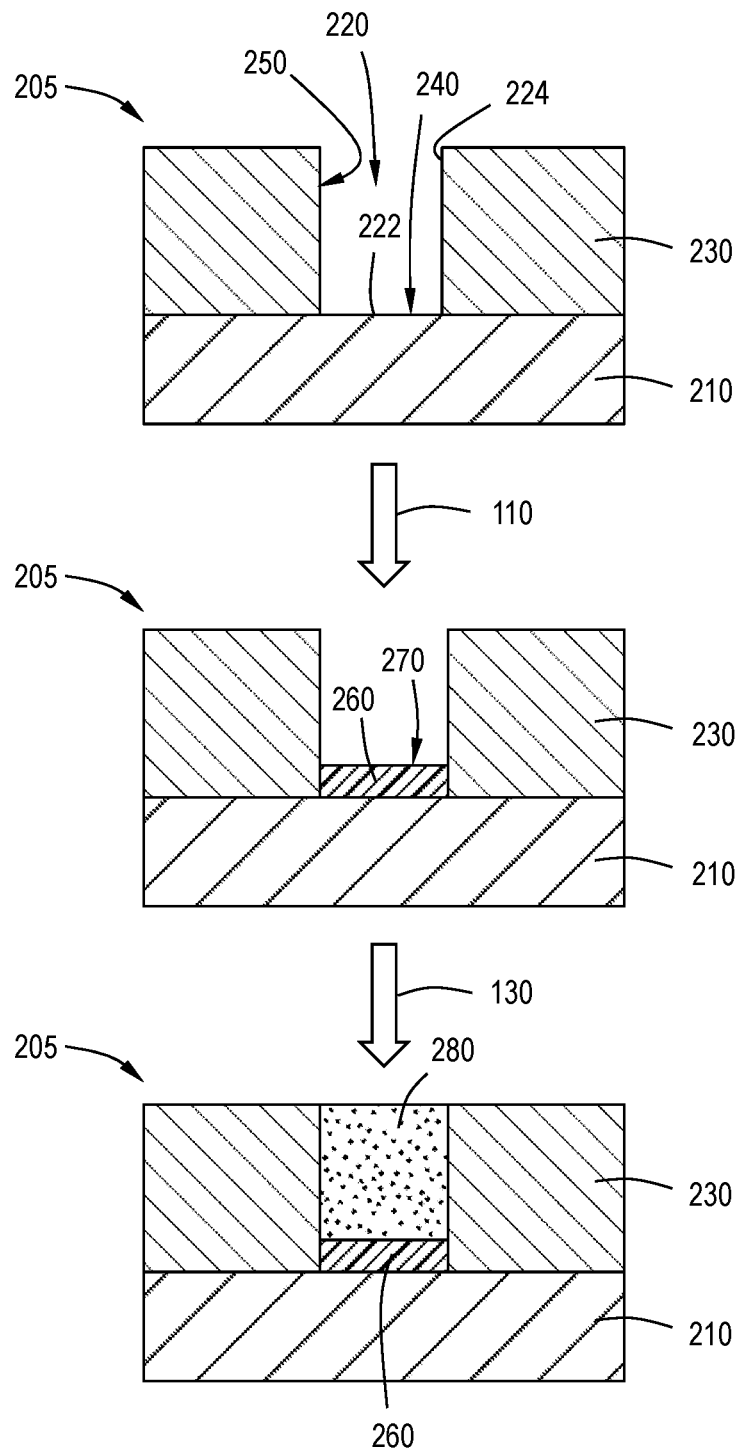
FIG. 2 illustrates various views of a substrate during different stages of the method of FIG. 1.

With reference to FIGS. 1 and 2, one or more embodiments of the disclosure are directed to method 100 of depositing a metal contact stack on a substrate surface.

As used herein, a "substrate surface" refers to any substrate surface upon which a layer may be formed. The substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

The substrate surface may have one or more features formed therein, one or more layers formed thereon, and combinations thereof. FIG. 2 shows a substrate 205 having a feature 220 formed thereon. The feature 220 illustrated is a trench. The trench has a bottom 222 with a first surface 240 and a sidewall 224 with a second surface 250. In some embodiments, the first surface 240 and the second surface 250 comprises same materials. The first surface 240 of some embodiments comprises a first material and the second surface 250 comprises a second material different from the first material. For example, one of the surfaces may be a metal and the other a dielectric. In some embodiments, the first surface 240 and the second surface 250 have the same chemical composition but different physical properties (e.g., crystallinity). In describing the methods below, reference to the substrate 100 means the first surface 240 and second surface 250 or a single surface in which the features 220 is formed. In some embodiments, the feature has a width in a range of from 8 nm to 16 nm, from 10 nm to 16 nm, from 12 nm to 16 nm, from 14 nm to 16 nm, from 8 nm to 14 nm, from 10 nm to 14 nm, from 12 nm to 14 nm, from 8 nm to 12 nm, from 10 nm to 12 nm or from 8 nm to 10 nm.

Referring back to FIG. 1, in some embodiments, the method 100 includes an optional pre-treatment operation 105. The pre-treatment can be any suitable pre-treatment known to the skilled artisan. Suitable pre-treatments include, but are not limited to, pre-heating, cleaning, soaking, native oxide removal, or deposition of an adhesion layer. In some embodiments, the pre-treatment comprises polishing, etching, reduction, oxidation, halogenation, hydroxylation, annealing, baking, or the like.

In some embodiments, the method 100 starts at deposition operation 110. At physical vapor deposition (PVD) operation 110, a process is performed to deposit a metal cap layer on the substrate 205 (or substrate surface). The skilled artisan is familiar with PVD processing. In some embodiments, the metal cap layer comprises tungsten or molybdenum containing species. FIG. 2 illustrates a substrate 205 having a metal cap layer 260. The metal cap layer 260 has a third surface 270 facing the trench.

In some embodiments, the metal cap layer 260 is directly deposited on the substrate. In some embodiments, the metal cap layer 260 is directly deposited on a metal silicide film.

In some embodiments, the physical vapor deposition (PVD) process comprises one or more of direct current (DC) or radio-frequency (RF) PVD. In some embodiments, the PVD process comprises RF and DC. In some embodiments, the DC is supplied to the substrate and the RF is supplied to the metal target. In one or more embodiments, the DC component has a power in a range of from 0 kilowatt (KW) to 100 kW, from 10 KW to 80 kW, from 20 KW to 60 KW, from 30 kW to 50 KW, from 40 KW to 50 KW. In one or more embodiments, radio frequency component has a power in range of from 1 KW to 10 KW, from 3 KW to 10 KW, from 5 KW to 10 KW, from 7 KW to 10 KW, from 1 KW to 7 KW, from 3 KW to 7 KW, from 5 KW to 7 KW, from 1 kW to 5 kW, from 3 kW to 5 KW, or from 1 KW to 3 KW.

In some embodiments, the PVD process comprises biasing the substrate to provide a directional deposition. In one or more embodiments, bias is in a range of from 0 W to 1200 W, from 0 W to 1000 W, from 0 W to 800 W, from 0 W to 600 W, from 0 W to 400 W, from 0 W to 200 W, from 0 W to 1200 W, from 200 W to 1000 W, from 200 W to 800 W, from 200 W to 600 W, from 200 W to 400 W, from 400 W to 1200 W, from 400 W to 1000 W, from 400 W to 800 W, from 400 W to 600 W, from 600 W to 1200 W, from 600 W to 1000 W, from 600 W to 800 W, from 800 W to 1200 W, from 800 W to 1000 W or from 1000 W to 1200 W.

In some embodiments, the PVD process occurs at a temperature in a range of from 200° C. to 450° C., from 250° C. to 450° C., from 300° C. to 450° C., from 350° C. to 450° C., from 400° C. to 450° C., 200° C. to 400° C., from 250° C. to 400° C., from 300° C. to 400° C., from 350° C. to 400° C., 200° C. to 350° C., from 250° C. to 350° C., from 300° C. to 350° C., 200° C. to 300° C., from 250° C. to 300° C. or from 200° C. to 250° C.

In some embodiments, the PVD process occurs at a pressure in a range of from 0.5 mTorr to 500 mTorr, or in the range of 10 mTorr to 500 mTorr, or in the range of 25 mTorr to 250 mTorr, or in the range of 50 mTorr to 150 mTorr.

In some embodiments, the metal cap layer 260 comprises elemental metal. In some embodiments, the metal cap layer 260 consists essentially of metal. As used in this manner, the term "consists essentially of metal" means that the content of metal in the film is greater than or equal to about 80%, 85%, 90%, 95%, 98%, 99% or 99.5% metal, in atomic percent. Measurements of the composition of the metal cap layer 260 refer to the bulk portion of the metal cap layer 260, excluding interface regions where diffusion of elements from adjacent films may occur.

In some embodiments, the metal cap layer 260 is effective to inhibit and/or eliminate diffusion of undesirable elements into and/or silicon out of the underlying layer. In some embodiments, the metal cap layer 260 is deposited selectively on the first surface 240 of the first material 210 relative to the second surface 250 of the second material 230. In some embodiments, the metal cap layer 260 is deposited substantially only on the bottom 222 of the feature. As used in this manner, the term "substantially only" means that less than or equal to 5%, 2% or 1% of the metal cap layer forms on the sidewall of the feature. For example, the metal cap layer 260 has a thickness in a range of from 10 Å to 200 Å, from 20 Å to 200 Å, from 50 Å to 200 Å, from 100 Å to 200 Å, from 150 Å to 200 Å, from 10 Å to 150 Å, from 50 Å to 150 Å, from 100 Å to 150 Å, from 10 Å to 100 Å, from 50 Å to 100 Å, from 10 Å to 50 Å or from 10 Å to 30 Å.

Once the predetermined thickness of the metal cap layer has been formed, the method 100 moves to an atomic layer deposition 130 process. At deposition 130, a process is performed to deposit a molybdenum conductor layer on the substrate 205 (substrate surface). The deposition process 130 can include one or more operations to form the molybdenum conductor layer on the substrate 205. In some embodiments, the deposition process 130 is selective for deposition on the metal cap layer 260.

"Atomic layer deposition" or "cyclical deposition" as used herein refers to the sequential exposure of two or more reactive compounds to deposit a layer of material on a substrate 205 (or substrate surface). As used in this specification and the appended claims, the terms "reactive compound", "reactive gas", "reactive species", "precursor", "process gas" and the like are used interchangeably to mean a substance with a species capable of reacting with the substrate 205 (or substrate surface) or material on the substrate 205 (or substrate surface) in a surface reaction (e.g., chemisorption, oxidation, reduction). The substrate 205, or portion of the substrate 205 is exposed sequentially to the two or more reactive compounds which are introduced into a reaction zone of a processing chamber. In a time-domain ALD process, exposure to each reactive compound is separated by a time delay allowing each compound to adhere and/or react on the substrate 205 (or substrate surface). In a spatial ALD process, different portions of the substrate 205 (or substrate surface), or material on the substrate 205 (or substrate surface), are exposed simultaneously to the two or more reactive compounds so that any given point on the substrate 205 (or substrate surface) is substantially not exposed to more than one reactive compound simultaneously. As used in this specification and the appended claims, the term "substantially" used in this respect means, as will be understood by those skilled in the art, that there is the possibility that a small portion of the substrate 205 (or substrate surface) may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first-time delay. Next, a second precursor or compound B is pulsed into the reaction zone followed by a second time delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate 205 (or substrate surface). In either scenario, the ALD process of pulsing compound A, purge gas, compound B and purge gas is a cycle. A cycle can start with either compound A or compound B and continue the respective order of the cycle until achieving a film with the desired thickness.

In an aspect of a spatial ALD process, a first reactive gas and second reactive gas are delivered simultaneously to the reaction zone but are separated by an inert gas curtain and/or a vacuum curtain. The substrate 205 is moved relative to the gas delivery apparatus so that any given point on the substrate 205 is exposed to the first reactive gas and the second reactive gas.

The atomic layer deposition 130 process of some embodiments comprises sequential exposures to a precursor and a reactant. At operation 132, the substrate 205 (or substrate surface) is optionally exposed to a reactant. In some embodiments, the third surface 270 is exposed to the reactant. In some embodiments, the reactant comprises a reducing agent. The reducing agent may be any suitable compound known to a skilled in the art. In some embodiments, the reducing agent comprises hydrogen ($H_2$).

In some embodiments, the substrate 205 (or substrate surface) is exposed to a reducing agent at a temperature in a range of from 350° C. to 550° C., from 400° C. to 550° C., from 450° C. to 550° C., 500° C. to 550° C., from 350° C. to 500° C., from 400° C. to 500° C., from 450° C. to 500° C., from 350° C. to 450° C., from 400° C. to 450° C. or from 350° C. to 400° C.

In some embodiments, the substrate 205 (or substrate surface) is exposed to a reducing agent for a duration of time in a range of from 5 seconds to 60 minutes, from 1 minutes to 60 minutes, from 5 minutes to 60 minutes, from 10 minutes to 60 minutes, from 20 minutes to 60 minutes, from 40 minutes to 60 minutes, from 5 seconds to 40 minutes, from 1 minutes to 40 minutes, from 5 minutes to 40 minutes, from 10 minutes to 40 minutes, from 20 minutes to 40 minutes, from 5 seconds to 20 minutes, from 1 minutes to 20 minutes, from 5 minutes to 20 minutes, from 10 minutes to 20 minutes, from 5 seconds to 10 minutes, from 1 minutes to 10 minutes or from 5 minutes to 10 min.

In some embodiments, the substrate 205 (or substrate surface) is exposed to a reducing agent at a dose in a range of from 100 sccm to 7000 sccm, from 500 sccm to 7000 sccm, from 1000 sccm to 7000 sccm, from 3000 sccm to 7000 sccm, from 5000 sccm to 7000 sccm, from 100 sccm to 5000 sccm, from 500 sccm to 5000 sccm, from 1000 sccm to 5000 sccm, from 3000 sccm to 5000 sccm, from 100 sccm to 3000 sccm, from 500 sccm to 3000 sccm, from 1000 sccm to 3000 sccm, from 100 sccm to 1000 sccm, from 500 sccm to 1000 sccm or from 100 sccm to 500 sccm.

In some embodiments, the substrate 205 (or substrate surface) is exposed to a reducing agent at a pressure in a range of from 5 Torr to 50 Torr, from 10 Torr to 50 Torr, from 25 Torr to 50 Torr, from 5 Torr to 25 Torr, from 10 Torr to 25 Torr or from 5 Torr to 10 Torr.

At operation 134, the processing chamber is optionally purged to remove unreacted reactant, reaction products, and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the metal precursor by any suitable technique including, but not limited to, moving the substrate through a gas curtain to a portion or sector of the processing chamber that contains none or substantially none of the metal precursor. In one or more embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of argon (Ar), nitrogen ($N_2$), hydrogen ($H_2$), and helium (He).

In operation 136, the substrate 205 (or substrate surface) is exposed to a molybdenum precursor to deposit the molybdenum conductor layer on the substrate 205 (or substrate surface). In operation 136, the substrate 205 (or substrate surface) is exposed to a molybdenum precursor to deposit the molybdenum conductor layer on the metal cap layer 260. In operation 136, the substrate 205 (or substrate surface) is exposed to a molybdenum precursor to deposit the molybdenum conductor layer on the reduced metal cap layer. The molybdenum precursor can be any suitable molybdenum-containing compound that can react with (i.e., adsorb or chemisorb onto) the substrate surface to leave a molybdenum-containing species on the substrate surface.

FIG. 2 shows the molybdenum conductor layer 280 deposited on the metal cap layer 260. In some embodiments, the molybdenum conductor layer 280 comprises a molybdenum containing species. The molybdenum conductor layer 280 of some embodiments comprises a combination of layers to provide an active contact and/or a metal contact.

In some embodiments, the molybdenum conductor layer 280 is deposited directly on the metal cap layer 260 in the absence of an air break. Processes of this sort are also referred to as an in-situ process. In some embodiments of in-situ processing, the atomic layer deposition 130 process starts at operation 136, with exposure of the substrate to the molybdenum precursor.

In one or more embodiments, the molybdenum precursor comprises any suitable precursor known to the skilled artisan. The molybdenum precursors of one or more embodiments are volatile and thermally stable, and, thus, suitable for vapor deposition. In some embodiments, the molybdenum precursor comprises a molybdenum halide.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F−), chloride (Cl−), bromide (Br−), iodide (I−), and astatide (At−). Accordingly, as used herein, the term "molybdenum halide" refers to any coordination complex of molybdenum with one or more halogen or halide ligand. The term molybdenum halide includes molybdenum mixed halides which have at least two different halide atoms.

In one or more embodiments, the molybdenum halide is selected from one or more of molybdenum chloride, molybdenum pentachloride, molybdenum bromide, molybdenum bromochloride, molybdenum bromoiodide, molybdenum chlorobromide, molybdenum chloroiodide, molybdenum iodobromide, molybdenum iodochloride.

In some embodiments, the molybdenum precursor comprises a molybdenum oxyhalide species. In some embodiments, the molybdenum oxyhalide species comprises one or more of molybdenum tetrachloride oxide ($MoCl_4O$), molybdenum tetrabromide oxide ($MoBr_4O$), molybdenum tetraiodide oxide ($MoI_4O$), molybdenum dibromide dioxide ($MoO_2Br_2$), molybdenum dichloride dioxide ($MoCl_2O_2$), and/or molybdenum diiodide dioxide ($MoI_2O_2$).

In some embodiments, the substrate 205 (or substrate surface) is exposed to the molybdenum precursor at a temperature in a range of from 350° C. to 550° C., from 400° C. to 550° C., from 450° C. to 550° C., 500° C. to 550° C., from 350° C. to 500° C., from 400° C. to 500° C., from 450° C. to 500° C., from 350° C. to 450° C., from 400° C. to 450° C. or from 350° C. to 400° C.

In some embodiments, the substrate 205 (or substrate surface) is exposed to the molybdenum precursor for a duration of time in a range of from 0.25 seconds to 20 minutes, from 10 seconds to 20 minutes, from 1 minutes to 20 minutes, from 5 minutes to 20 minutes, from 10 minutes to 20 minutes, from 0.25 seconds to 10 minutes, from 10 seconds to 10 minutes, from 1 minutes to 10 minutes, from 5 minutes to 10 minutes, from 0.25 seconds to 5 minutes, from 10 seconds to 5 minutes, from 1 minutes to 5 minutes, from 0.25 seconds to 1 minutes or from 10 seconds to 1 min.

In some embodiments, the substrate 205 (or substrate surface) is exposed to the molybdenum precursor at a dose in a range of from 50 sccm to 700 sccm, from 100 sccm to 700 sccm, from 300 sccm to 700 sccm, from 500 sccm to 700 sccm, from 50 sccm to 500 sccm, from 100 sccm to 500 sccm, from 300 sccm to 500 sccm, from 50 sccm to 300 sccm, from 100 sccm to 300 sccm or from 50 sccm to 100 sccm.

In some embodiments, the substrate 205 (or substrate surface) is exposed to the molybdenum precursor at a pressure in a range of from 5 Torr to 50 Torr, from 10 Torr to 50 Torr, from 25 Torr to 50 Torr, from 5 Torr to 25 Torr, from 10 Torr to 25 Torr or from 5 Torr to 10 Torr.

In some embodiments, the molybdenum conductor layer 280 formed comprises elemental molybdenum. In some embodiments, the molybdenum conductor layer 280 consists essentially of molybdenum. As used in this manner, the term "consists essentially of molybdenum" means that the content of molybdenum in the film is greater than or equal to about 80%, 85%, 90%, 95%, 98%, 99% or 99.5% molybdenum, in atomic percent. Measurements of the composition of the molybdenum conductor layer 280 refer to the bulk portion of the molybdenum conductor layer 280, excluding interface regions where diffusion of elements from adjacent films may occur.

The deposition operation 130 can be repeated to deposit a molybdenum conductor layer 280, having a predetermined thickness. In some embodiments, the deposition operation 130 is repeated to provide a molybdenum conductor layer 280 having a thickness in the range of from 1 nm to 50 nm, from 5 nm to 50 nm, from 10 nm to 50 nm, from 25 nm to 50 nm, from 1 nm to 25 nm, from 5 nm to 25 nm, from 10 nm to 25 nm, from 1 nm to 10 nm, from 5 nm to 10 nm or from 1 nm to 5 nm.

In some embodiments, the molybdenum precursor further comprises a co-reactant. In some embodiments, the co-reactant is a reducing agent. In some embodiments, the co-reactant is hydrogen ($H_2$).

In some embodiments, the molybdenum precursor is used to pretreat the metal cap layer 260 before depositing the molybdenum conductor layer 280. In some embodiments, the pretreat comprises etching. In some embodiments, the etching is performed for a time duration in a range of from 5 seconds to 20 minutes, from 10 seconds to 20 minutes, from 1 minutes to 20 minutes, from 5 minutes to 20 minutes, from 10 minutes to 20 minutes, from 5 seconds to 10 minutes, from 10 seconds to 10 minutes, from 1 minutes to 10 minutes, from 5 minutes to 10 minutes, from 5 seconds to 5 minutes, from 10 seconds to 5 minutes, from 1 minutes to 5 minutes, from 5 seconds to 1 minutes or from 10 seconds to 1 min. In some embodiments, the etching is performed by the molybdenum precursor at a dose in a range of from 5 sccm to 700 sccm, from 50 sccm to 700 sccm, from 100 sccm to 700 sccm, from 300 sccm to 700 sccm, from 5 sccm to 500 sccm, from 50 sccm to 500 sccm, from 100 sccm to 500 sccm, from 300 sccm to 500 sccm, from 5 sccm to 300 sccm, from 50 sccm to 300 sccm, from 100 sccm to 300 sccm, from 5 sccm to 100 sccm, from 50 sccm to 100 sccm or from 5 sccm to 50 sccm.

At operation 138, the processing chamber is optionally purged to remove unreacted molybdenum precursor, reaction products, and by-products. Purging the processing chamber in operation 138 can be the same process or different process than the purge in operation 134. Purging the processing chamber, portion of the processing chamber, area adjacent the substrate surface, etc., removes unreacted molybdenum precursor, reaction products and by-products from the area adjacent the substrate surface.

In the embodiment illustrated in FIG. 1, at deposition operation 130, the substrate (or substrate surface) is exposed to the reactant and the molybdenum precursor sequentially. In some embodiments, the substrate (or substrate surface) is exposed to the molybdenum precursor first, followed by exposure to the reactant second. In other embodiments, the substrate (or substrate surface) is exposed to the reactant first, followed by exposure to the molybdenum precursor second. In another, un-illustrated, embodiment, the substrate (or substrate surface) is exposed to the molybdenum precursor and the reactant substantially simultaneously.

In some embodiments, the molybdenum conductor layer 280 is formed inside the feature 220 on the third surface 270 of the metal cap layer 260. The molybdenum conductor layer 280 of some embodiments fills the gap formed by the feature in a bottom-up manner. As used in this manner, "bottom-up" means that the deposition occurs substantially on the bottom of the feature relative to the sidewalls.

At decision 140, the thickness of the molybdenum conductor layer 280 is considered. If the molybdenum conductor layer 280 has reached a predetermined thickness, the method 100 moves to an optional post-processing operation 150. If the thickness of the molybdenum conductor layer 280 or the number of process cycles has not reached the predetermined threshold, the method 100 returns to operation 130 and continuing.

In one or more embodiments, the method comprises: depositing a metal cap layer in the feature of a substrate in a first processing chamber; moving the substrate to a second processing chamber that is integrated with the first processing chamber such that there is not an air break between the first and second processing chambers; and depositing a molybdenum conductor layer on the metal cap layer. In one or more embodiments, the method comprises: depositing a metal cap layer in the feature of a substrate in a first processing chamber; moving the substrate to a second processing chamber that is integrated with the first processing chamber such that there is not an air break between the first and second processing chambers; exposing the metal cap layer to a reactant; moving the substrate to a third processing chamber that is integrated with the second processing chamber such that there is not an air break between the second and third processing chambers; and depositing a molybdenum conductor layer on the reducing agent treated metal cap layer.

The optional post-processing operation 150 can be, for example, a process to modify film properties (e.g., annealing) or a further film deposition process (e.g., additional ALD or CVD processes) to grow additional films. In some embodiments, the optional post-processing operation 150 can be a process that modifies a property of the deposited film. In some embodiments, the optional post-processing operation 150 comprises annealing the as-deposited film. In some embodiments, annealing is done at temperatures in the range of about 300° C., 400° C., 500° C., 600° C., 700° C., 800° C., 900° C. or 1000° C. The annealing environment of some embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In some embodiments, the film is annealed for a predetermined time in the range of about 15 seconds to about 90 minutes, or in the range of about 1 minute to about 60 minutes. In some embodiments, annealing the as-deposited film increases the density, decreases the resistivity and/or increases the purity of the film. In one or more embodiments, annealing can also with performed with a gas under plasma. In one or more embodiments, the annealing temperature may be lower with plasma.

In one or more embodiments, the plasma comprises one or more of nitrogen ($N_2$), argon (Ar), helium (He), hydrogen ($H_2$), carbon monoxide (CO), carbon dioxide ($CO_2$) methane ($CH_4$), and ammonia ($NH_3$). In some embodiments, the plasma is a remote plasma. In other embodiments, the plasma is a direct plasma.

In one or more embodiments, the plasma may be generated remotely or within the processing chamber. In one or more embodiments, the plasma is an inductively coupled plasma (ICP) or a conductively coupled plasma (CCP). In other embodiments, the plasma is a microwave plasma. Any suitable power can be used depending on, for example, the reactants, or the other process conditions. In some embodiments, the plasma is generated with a plasma power in the range of about 10 W to about 3000 W. In some embodiments, the plasma is generated with a plasma power less than or equal to about 3000 W, less than or equal to about 2000 W, less than or equal to about 1000 W, less than or equal to about 500 W, or less than or equal to about 250 W.

One or more embodiments of the disclosure are directed to methods of depositing the film in high aspect ratio features. A high aspect ratio feature is a trench, via or pillar having a height:width ratio greater than or equal to about 10, 20, or 50, or more. In some embodiments, the film is deposited conformally on the high aspect ratio feature. As used in this manner, a conformal film has a thickness near the top of the feature that is in the range of about 80-120% of the thickness at the bottom of the feature.

Some embodiments of the disclosure are directed to methods for bottom-up gapfill of a feature. A bottom-up gapfill process fills the feature from the bottom versus a conformal process which fills the feature from the bottom and sides. In some embodiments, the feature has a first material at the bottom and a second material at the sidewalls. In some embodiments, the metal cap layer deposit selectively on the first material relative to the second material so that the metal cap layer fills the feature in a bottom-up manner. In some embodiments, the molybdenum conductor layer deposit selectively on the first material relative to the second material so that the molybdenum conductor layer fills the feature in a bottom-up manner.

According to one or more embodiments, the substrate may be subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Atomic Layer Deposition of the Film

A substrate having a 10-12 nm trench was placed in a processing chamber. A DC PVD process was used to deposit a metal cap layer. More specifically, a metal precursor comprising tungsten was flowed into the processing chamber over the substrate at a direct current of 35 KW, a bias of 1160 W. Unreacted precursor and byproducts are then purged out of the chamber. Next, a molybdenum conductor layer was deposited on the metal layer using thermal ALD process. The resulting metal contact stack has a sheet resistance of 14 $\mu\Omega$-cm.

A substrate having a 10-12 nm trench was placed in a processing chamber. A RF PVD process was used to deposit a metal cap layer. More specifically, a metal precursor comprising tungsten was flowed into the processing chamber over the substrate at a radio frequency of 3 KW, a bias of 50 W and a pressure of 230 mTorr. Unreacted precursor and byproducts are then purged out of the chamber. Next, a molybdenum conductor layer was deposited on the metal layer using thermal ALD process. The resulting metal contact stack has a sheet resistance of 17 $\mu\Omega$-cm.

A substrate having a 10-12 nm trench was placed in a processing chamber. A RF PVD process was used to deposit a metal cap layer. More specifically, a metal precursor comprising molybdenum was flowed into the processing chamber over the substrate at a radio frequency of 3 kW, a bias of 50 W and a pressure of 100 mTorr. Unreacted precursor and byproducts are then purged out of the chamber. Next, a molybdenum conductor layer was deposited on the metal layer using thermal ALD process. The resulting metal contact stack has a sheet resistance of 20 µΩ-cm.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of fabricating a microelectronic device, the method comprising depositing a metal contact stack by:
   depositing a metal cap layer comprising tungsten on a substrate by a DC physical vapor deposition (PVD) process or an RF PVD process; and
   depositing a molybdenum conductor layer by atomic layer deposition (ALD) on the metal cap layer, wherein the substrate comprises a gate electrode on a gate dielectric layer on a surface of the substrate and a structure having at least one sidewall and a bottom, the at least one sidewall including a dielectric and the bottom including a metal, and the metal cap layer is deposited selectively on the bottom of the structure relative to the at least one sidewall.

2. The method of claim 1, wherein the metal cap layer is deposited at a temperature in the range of 300° C. to 350° C.

3. The method of claim 1, wherein the metal cap layer is deposited to a thickness in a range of from 10 Å to 200 Å.

4. The method of claim 1, wherein the ALD process is a thermal process.

5. The method of claim 1, wherein the molybdenum conductor layer is deposited selectively on the metal cap layer.

6. The method of claim 1, wherein the ALD process comprises exposing the substrate sequentially to a reactant and a molybdenum precursor.

7. The method of claim 6, wherein the molybdenum precursor comprises a molybdenum halide or molybdenum oxyhalide.

8. The method of claim 7, wherein the molybdenum precursor comprises one or more of molybdenum pentachloride or molybdenum dichloride dioxide.

9. The method of claim 6, wherein the reactant comprises hydrogen ($H_2$).

10. The method of claim 6, wherein the molybdenum conductor layer is deposited to a thickness in the range of from 1 nm to 50 nm.

11. The method of claim 6, wherein the ALD process occurs at a temperature in the range of 450° C. to 500° C.

12. The method of claim 1, wherein the metal contact stack has a sheet resistance less than or equal to 20 µΩ-cm at a total thickness of 100 Å.

13. The method of claim 12, wherein the structure has a width in a range of 10 nm to 12 nm.

14. The method of claim 12, wherein the structure is filled in a bottom-up manner.

15. A method of depositing a metal contact stack having a sheet resistance in a range of from 10 µΩ-cm to 20 µΩ-cm, the method comprising:
   a. depositing a metal cap layer on a substrate by DC physical vapor deposition (PVD), wherein the substrate is exposed to a metal precursor comprising tungsten at a direct current of 35 KW, a bias of 1160 W, and
   depositing a molybdenum conductor layer by thermal atomic layer deposition on the metal cap layer, wherein the metal cap layer is exposed to a molybdenum precursor;
   b. depositing a metal cap layer on a substrate by RF physical vapor deposition (PVD), wherein the substrate is exposed to a metal precursor comprising tungsten at a radio frequency of 3 KW, a bias of 50 W and a pressure of 230 mTorr; and depositing a molybdenum conductor layer by thermal atomic layer deposition on the metal cap layer, wherein the metal cap layer is exposed to a molybdenum precursor; or c. depositing a metal cap layer on a substrate by RF physical vapor deposition (PVD), wherein the substrate is exposed to a metal precursor comprising molybdenum at a radio frequency of 3 KW, a bias of 50 W and a pressure of 100 mTorr, and depositing a molybdenum conductor layer by thermal atomic layer deposition on the metal cap layer, wherein the metal cap layer is exposed to a molybdenum precursor.

* * * * *